(12) United States Patent
Matsumoto et al.

(10) Patent No.: US 9,941,230 B2
(45) Date of Patent: Apr. 10, 2018

(54) ELECTRICAL CONNECTING STRUCTURE BETWEEN A SUBSTRATE AND A SEMICONDUCTOR CHIP

(71) Applicant: INTERNATIONAL BUSINESS MACHINES CORPORATION, Armonk, NY (US)

(72) Inventors: Keiji Matsumoto, Kanagawa-ken (JP); Keishi Okamoto, Kanagawa (JP); Yasumitsu K. Orii, Shiga-ken (JP); Kazushige Toriyama, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/985,009

(22) Filed: Dec. 30, 2015

(65) Prior Publication Data

US 2017/0194277 A1    Jul. 6, 2017

(51) Int. Cl.
*H01L 23/00* (2006.01)
*G02B 6/42* (2006.01)

(52) U.S. Cl.
CPC ............ *H01L 24/13* (2013.01); *G02B 6/4219* (2013.01); *H01L 24/16* (2013.01); *H01L 24/81* (2013.01); *H01L 2224/1146* (2013.01); *H01L 2224/1147* (2013.01); *H01L 2224/11312* (2013.01); *H01L 2224/131* (2013.01); *H01L 2224/1319* (2013.01); *H01L 2224/13082* (2013.01); *H01L 2224/13124* (2013.01); *H01L 2224/13147* (2013.01); *H01L 2224/13166* (2013.01); *H01L 2224/1601* (2013.01);
(Continued)

(58) Field of Classification Search
CPC ......... H01L 2224/13624; H01L 2224/136666; H01L 2224/1369; H01L 2225/06513; H01L 2224/73253; H01L 2224/73204; H01L 24/00; H01L 21/4814–21/4896
See application file for complete search history.

(56) References Cited

U.S. PATENT DOCUMENTS

| | | | | |
|---|---|---|---|---|
| 6,130,149 A | * | 10/2000 | Chien | ........................ C23C 8/10 257/E21.508 |
| 7,754,976 B2 | * | 7/2010 | Greiner | ................... H05K 1/144 174/259 |

(Continued)

OTHER PUBLICATIONS

Sakuma, K. et al., "Differential heating/cooling chip joining method to prevent chip package interaction issue in large die with ultra low-k technology" IEEE 62nd Electronic Components and Technology Conference (ECTC), May 2012. (pp. 430-435).

*Primary Examiner* — Mohsen Ahmadi
(74) *Attorney, Agent, or Firm* — Tutunjian & Bitetto, P.C.; Vazken Alexanian

(57) ABSTRACT

The present invention provides an electrical connecting structure between a substrate 21 and a semiconductor chip 22. The electrical connecting structure comprises a metal bump 26 formed on a contact pad 28 of a semiconductor chip 22 and a coating layer 25 formed on the metal bump 26 of the semiconductor chip 22. The coating layer includes material not wettable with solder. The electrical connecting structure further comprises a metal pad 24 formed on the substrate 21. The electrical connecting structure further comprises a solder 29 connecting to a side surface of the metal bump 26 and an outer surface of the metal pad 24. The outer surface is not covered by the coating layer 25.

15 Claims, 4 Drawing Sheets

(52) U.S. Cl.
CPC ............... *H01L 2224/16058* (2013.01); *H01L 2224/16237* (2013.01); *H01L 2224/814* (2013.01); *H01L 2224/81191* (2013.01); *H01L 2224/81815* (2013.01); *H01L 2225/06513* (2013.01); *H01L 2924/014* (2013.01); *H01L 2924/3841* (2013.01)

(56) References Cited

U.S. PATENT DOCUMENTS

| | | | |
|---|---|---|---|
| 8,084,861 B2 | 12/2011 | Otremba | |
| 8,293,370 B2 * | 10/2012 | Yamaguchi | B23K 35/025 |
| | | | 148/23 |
| 8,405,227 B2 | 3/2013 | Tanida et al. | |
| 8,564,955 B2 * | 10/2013 | Schmidt | H01L 23/367 |
| | | | 165/104.33 |
| 8,952,267 B2 | 2/2015 | Chen et al. | |
| 9,263,378 B1 * | 2/2016 | Nah | H01L 21/0334 |
| 2006/0151879 A1 * | 7/2006 | Ernst | H01L 21/4842 |
| | | | 257/737 |
| 2007/0085205 A1 * | 4/2007 | Chen | H01L 23/5389 |
| | | | 257/737 |
| 2007/0087547 A1 * | 4/2007 | Chen | H01L 24/11 |
| | | | 438/613 |
| 2007/0200234 A1 * | 8/2007 | Gerber | H01L 21/563 |
| | | | 257/734 |
| 2007/0281557 A1 * | 12/2007 | Shih | H01L 21/4846 |
| | | | 439/876 |
| 2009/0050359 A1 * | 2/2009 | Hu | H05K 1/111 |
| | | | 174/262 |
| 2009/0200686 A1 * | 8/2009 | Tsang | H01L 23/49811 |
| | | | 257/784 |
| 2009/0243059 A1 * | 10/2009 | Chen | H01L 23/4951 |
| | | | 257/673 |
| 2011/0101526 A1 | 5/2011 | Hsiao et al. | |
| 2011/0156252 A1 * | 6/2011 | Lin | H01L 21/568 |
| | | | 257/738 |
| 2011/0227186 A1 * | 9/2011 | Chang | H01L 23/481 |
| | | | 257/448 |
| 2012/0119379 A1 * | 5/2012 | Koizumi | H01L 23/5389 |
| | | | 257/774 |
| 2013/0285261 A1 | 10/2013 | Tan | |
| 2013/0313594 A1 * | 11/2013 | Han | H01L 33/62 |
| | | | 257/98 |
| 2014/0090880 A1 * | 4/2014 | Chen | H05K 1/09 |
| | | | 174/257 |
| 2014/0206146 A1 * | 7/2014 | Lin | H01L 21/568 |
| | | | 438/113 |
| 2015/0325507 A1 * | 11/2015 | Uzoh | H01L 23/3114 |
| | | | 257/737 |
| 2015/0325544 A1 * | 11/2015 | Wang | H01L 21/50 |
| | | | 257/738 |
| 2017/0092621 A1 * | 3/2017 | Das | H01L 25/0657 |

* cited by examiner

ELECTRICAL CONNECTING STRUCTURE BETWEEN A SUBSTRATE AND A SEMICONDUCTOR CHIP

BACKGROUND

Technical Field

The present invention relates to an electrical connecting structure, and more specifically, to an electrical connecting structure between a substrate and a semiconductor chip.

Description of the Related Art

FIG. 1 shows an example of a conventional electrical package 50 for optical communication. FIG. 1 shows a part of a cross-sectional diagram of the electrical package 50. The electrical package 50 includes a substrate 1, a semiconductor chip 2 electrically connected to the substrate 1 using an electrical connecting structure which includes a solder 5 and a Cu pillar 6 (Cu bump). A metal pad 4 formed in an insulating layer 3 on the substrate 1 electrically connects to a contact pad 8 formed in an insulating layer 7 on the semiconductor chip 2 via the electrical connecting structure.

The electrical package 50 further includes a pedestal 9 on the insulating layer 3 on the substrate 1 and an optical waveguide 10. The optical waveguide 10 is aligned with a light input/output port 11 formed at the side surface of the semiconductor chip 2. The semiconductor chip 2 includes a light emitting device (for example, laser diode, LED)/light receiving device (for example, photo diode). As shown by the arrow 12, light passes through between the light input/output port 11 and the optical waveguide 10.

In the conventional electrical package 50, when the position in z-direction (perpendicular direction) of the semiconductor chip 2 and the optical waveguide 10 is different by several micrometers (μm), the light coupling efficiency reduces. For example, when inter-metallic compounds (IMCs) are generated between the Cu bump of the semiconductor chip 2 and the metal pad 4 on the substrate 1, it is very difficult to control the thickness of IMCs and the Z-position of the semiconductor chip 2 and of the optical waveguide 10, which tends to vary by several μm.

Also, in mobile applications, thinner packages are required. Under these circumstances, the short joint height between the semiconductor chip 2 and the substrate 1 can potentially contribute to thinner packages. But, in the short joint height, the effect of volume shrinkage during IMCs formation becomes prominent, and it tends to generate cracks in the joint at thermal cycle (stress).

Therefore, it is necessary to control the electrical connecting structure between the substrate 1 and the semiconductor chip 2 in order to control, for example, the Z-position of the semiconductor chip 2 and the optical waveguide 10.

SUMMARY

The present invention provides an electrical connecting structure between a substrate and a semiconductor chip. The electrical connecting structure comprises a metal bump formed on a contact pad of a semiconductor chip and a coating layer formed on the metal bump of the semiconductor chip. The coating layer includes material not wettable with solder. The electrical connecting structure further comprises a metal pad formed on the substrate. The electrical connecting structure further comprises a solder connecting to a side surface of the metal bump and an outer surface of the metal pad. The outer surface is not covered by the coating layer.

The present invention provides an electrical package. The electrical package comprises a substrate, a semiconductor chip, and a plurality of electrical connecting structures between the substrate and the semiconductor chip. Each of the electrical connecting structures comprises a metal bump formed on a contact pad of a semiconductor chip and a coating layer formed on the metal bump of the semiconductor chip. The coating layer includes material not wettable with solder. The electrical connecting structure further comprises a metal pad formed on the substrate. The electrical package further comprises a solder connecting to a side surface of the metal bump and an outer surface of the metal pad. The outer surface is not covered by the coating layer.

DETAILED DESCRIPTION

Figure 1:
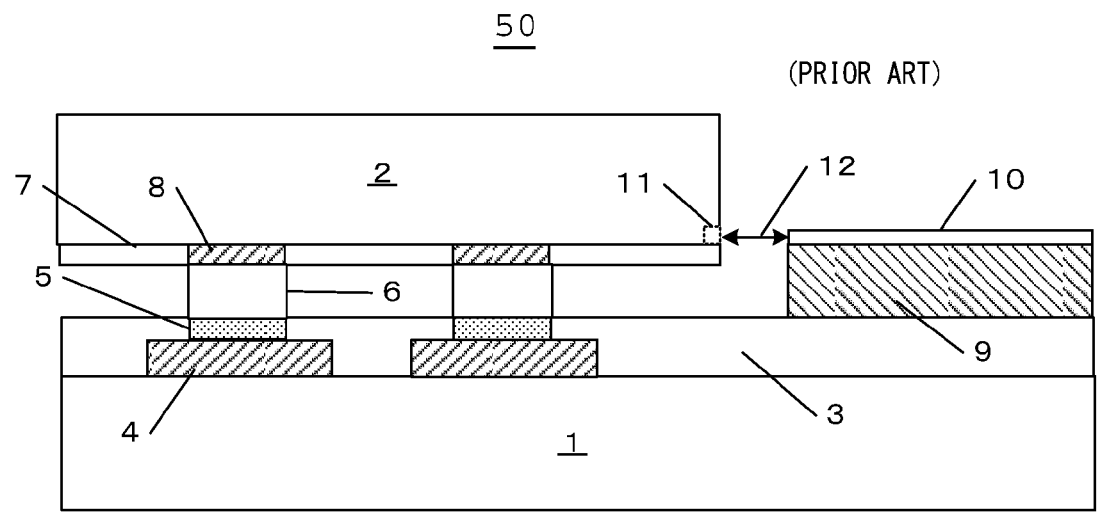
FIG. 1 is a cross-sectional diagram of a part of a conventional electrical package for optical communication.
Figure 2:
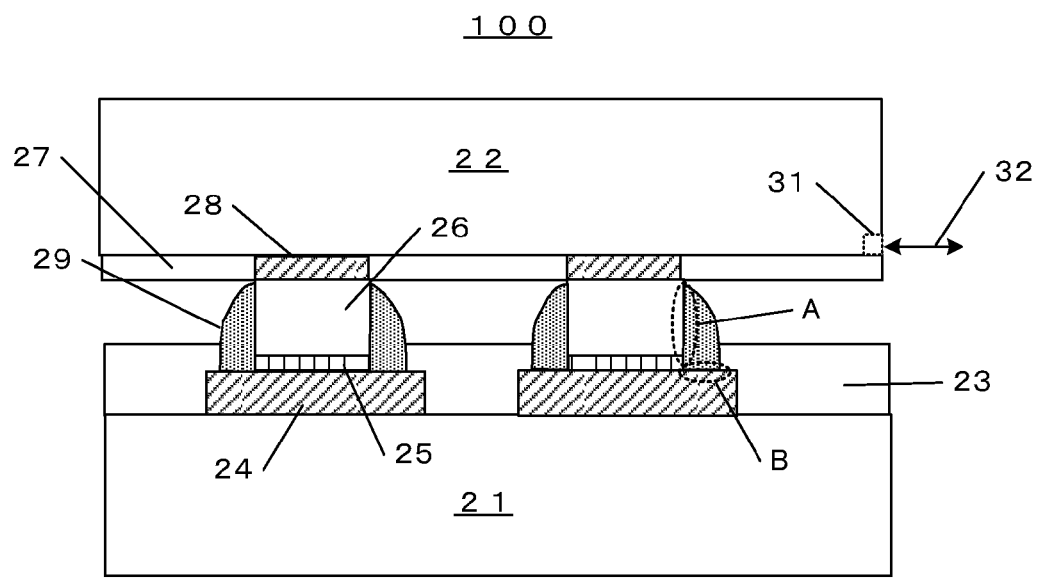
FIG. 2 is a cross-sectional diagram of a part of an electrical package using an electrical connecting structure of one embodiment of the present invention.

The following is an explanation of an embodiment of the present invention with reference to the drawings. FIG. 2 is a cross-sectional diagram of a part of an electrical package using an electrical connecting structure of one embodiment of the present invention. The electrical package 100 includes a substrate 21, a semiconductor chip 22 electrically connected to the substrate 21 using an electrical connecting structure which includes a coating layer 25, a Cu pillar (Cu bump) 26 and a solder 29. A metal pad 24 formed in an insulating layer 23 on the substrate 21 electrically connects to a contact pad 28 formed in an insulating layer 27 on the semiconductor chip 22 via the electrical connecting structure.

Figure 3:
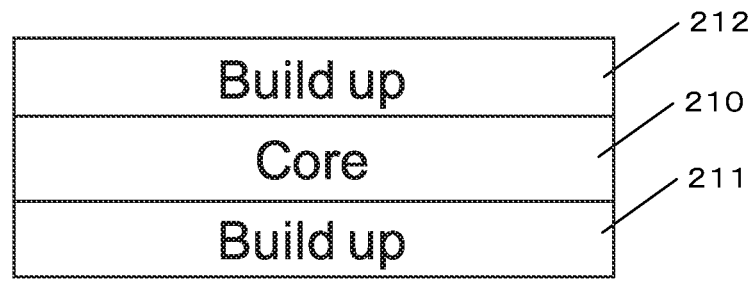
FIG. 3 is a cross-sectional diagram of a substrate of one embodiment of the present invention.

FIG. 3 shows an example of a cross section of the substrate 21. The substrate 21 includes a core layer 210 which is sandwiched by two buildup layers 211, 212. The core layer 210 includes organic materials and a plurality of conductive via to electrically connect between the two buildup layers 211, 212. The core layer 210 further includes metal layers and composite layers with dielectric materials enclosing glass fiber cloth. The buildup layers 211, 212 include a plurality of wiring layers and dielectric layers. The wiring layers include patterned metal layer in a dielectric material. The dielectric layers are in between the wiring layers.

The semiconductor chip 22 can include a light emitting device (for example, laser diode, LED)/light receiving device (for example, photo diode). As shown by the arrow 32, in FIG. 2, light can pass through an light input/output port 31. The semiconductor chip 22 may include a silicon chip or other semiconductor chip for an optical chip, for example. The semiconductor chip 22 is not limited to the optics chip and can include the semiconductor chip for other uses. The material of the semiconductor chip 22 is not limited to specific types.

A side surface of the coating layer 25 and a side surface of the Cu pillar 26 have a uniform perpendicular surface A. The solder 29 connects to the side surface A of the coating layer 25 and the Cu pillar 26. The solder 29 further connects to an outer surface B of the metal pad 24. The outer surface B is not covered by the coating layer 25.

The coating layer 25 includes material not wettable with solder. A bottom surface of the coating layer 25 is smaller than a surface of the metal pad 24. The coating layer 25 can include organic material. The organic material can include epoxy, polyimide, organic solderability preservative (OSP), or photo resist. The coating layer 25 further can include aluminum (Al) or titanium (Ti) layer.

In the electrical connecting structure in FIG. 2, if the coating layer 25 includes organic material, the electrical connecting between the metal pad 24 and the Cu pillar 26 is not obtained. However, the solder 29 can maintain the electrical connecting to electrically connect between the side surface A of the Cu pillar 26 and the outer surface B of the metal pad 24. That is, the electrical connection between the Cu pillar 26 and the metal pad 24 is established by solder on the side surface A of the Cu pillar 26 and the outer surface B of the metal pad 24.

In the electrical package 100 of one embodiment of the present invention, there is no solder between the top surface of the metal pad 24 and the bottom surface of the Cu pillar 26. That is, the Cu pillar 26 can directly contact to the metal pad 24 without solder or inter-metallic compounds (IMCs). In the result, the IMCs between the top surface of the metal pad 24 and the bottom surface of the Cu pillar 26 is not generated. The thickness between the top surface of the metal pad 24 and the bottom surface of the Cu pillar 26 is not almost changed under thermal cycle (stress).

And the Z-position of the semiconductor chip 22 can be controlled to maintain the light coupling efficiency between the light input/output port 31 of the semiconductor chip 22 and an outer optical waveguide. By this, precise distance control between the semiconductor 22 and the substrate 21 (or an optical waveguide) is realized, and also the cracks in the short joint of the electrical connecting structure can be eliminated.

Figure 4:
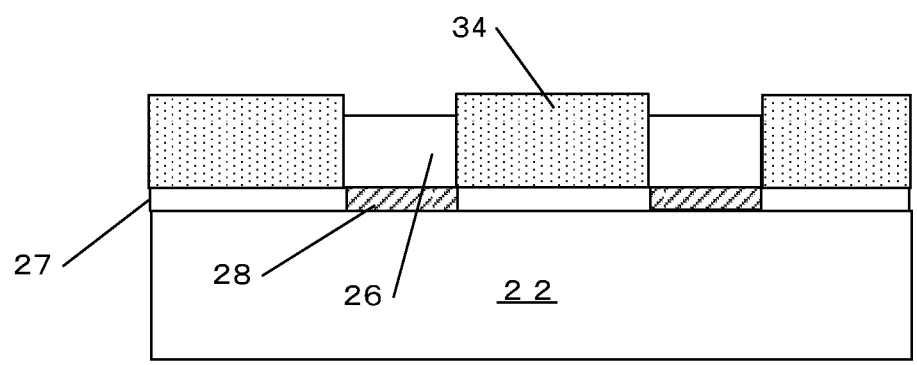
FIG. 4 is a cross-sectional diagram of each step of fabricating an electrical connecting structure of one embodiment of the present invention.
Figure 5:
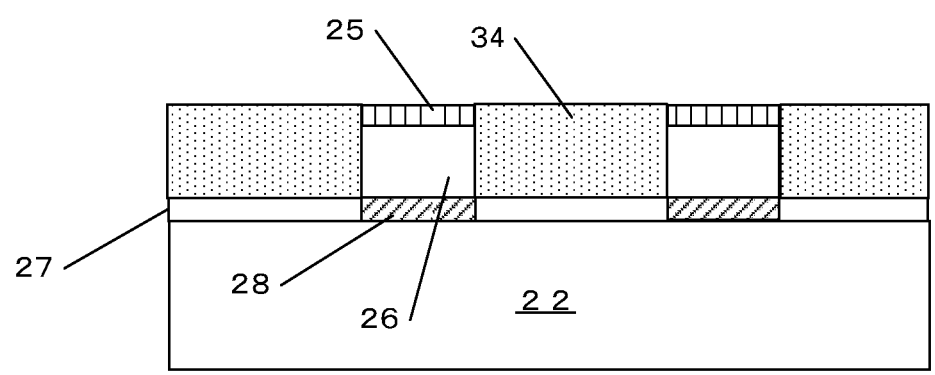
FIG. 5 is a cross-sectional diagram of each step of fabricating an electrical connecting structure of one embodiment of the present invention.

Next, an embodiment of a method of fabricating the electrical package 100, including the electrical connecting structure shown in FIG. 2, with reference to FIGS. 4-9, is shown. First, as shown in FIG. 4, a patterned resist layer 34 and a plated Cu layer 26 between the patterned resist layers 34 on the semiconductor chip 22 are prepared. Next, as shown in FIG. 5, the coating layer 25 is formed on the plated Cu layer 26 between the patterned resist layers 34. If the coating layer 25 includes organic material, the coating layer 25 is formed by squeezing organic material in the opening on the plated Cu layer 26. If the coating layer 25 includes an aluminum (Al) or titanium (Ti) layer, the aluminum (Al) or titanium (Ti) layer is formed by metal plating in the opening on the plated Cu layer 26.

Figure 6:
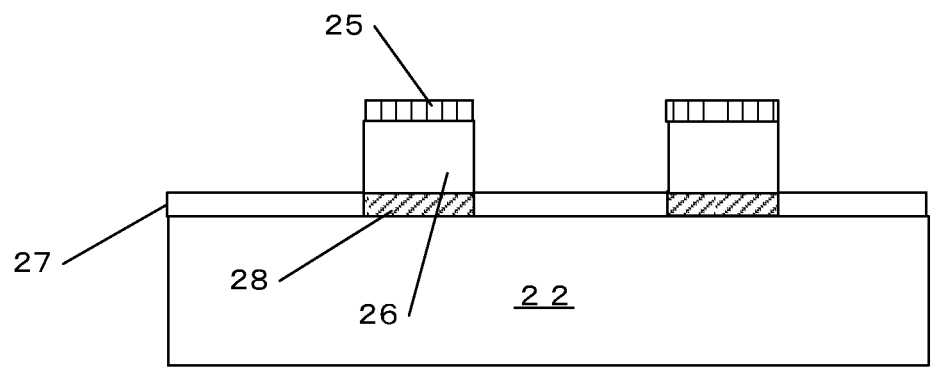
FIG. 6 is a cross-sectional diagram of each step of fabricating an electrical connecting structure of one embodiment of the present invention.
Figure 7:
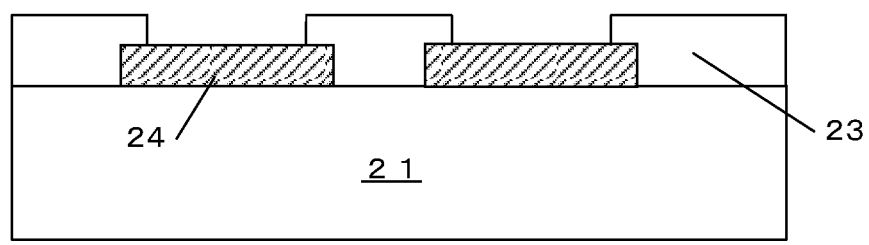
FIG. 7 is a cross-sectional diagram of each step of fabricating an electrical connecting structure of one embodiment of the present invention.
Figure 8:
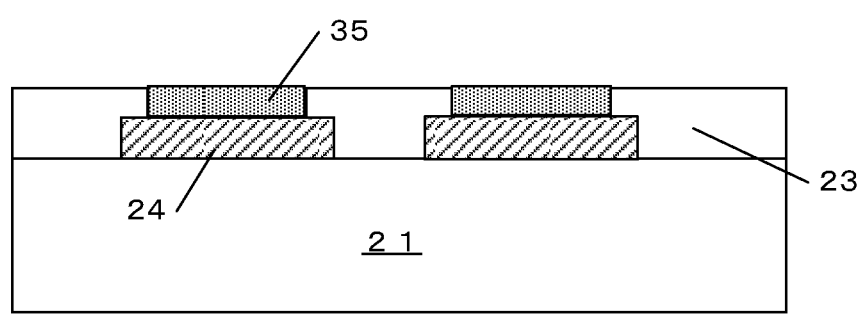
FIG. 8 is a cross-sectional diagram of each step of fabricating an electrical connecting structure of one embodiment of the present invention.
Figure 9:
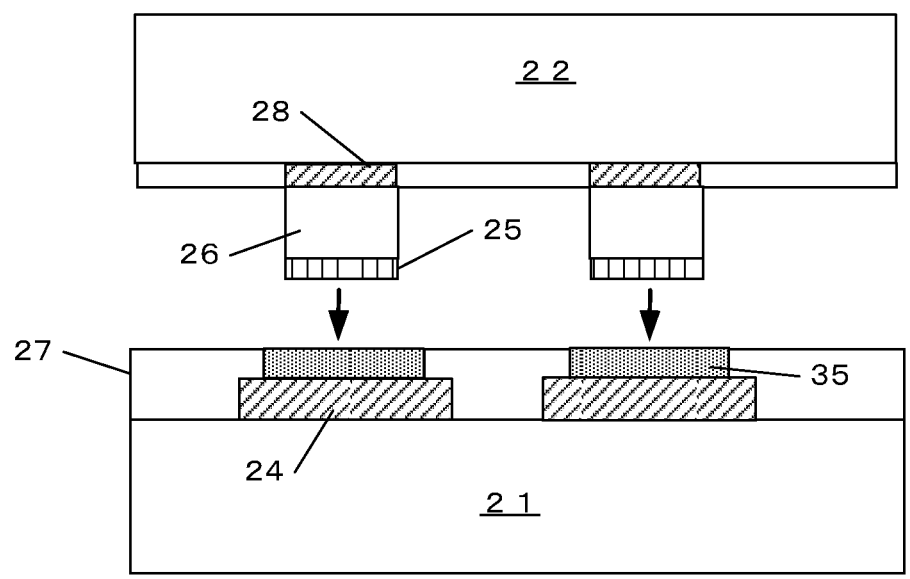
FIG. 9 is a cross-sectional diagram of each step of fabricating an electrical connecting structure of one embodiment of the present invention.

Next, as shown in FIG. 6, the pattered resist layer is stripped from the semiconductor chip 22. Next, as shown in FIG. 7, the substrate 21, which includes the metal pads 24 between the patterned insulating layers 23, is prepared. Next, as shown in FIG. 8, the solder paste 35 is formed in the opening on the metal pad 24. Next, as shown in FIG. 9, the semiconductor chip 22 is combined with the substrate 21. That is, the structure including the coating layer 25 on the Cu pillar 26 is combined with the solder paste 35 in the opening on the metal pad 24. Finally, the connected substrate 21 and semiconductor chip 22 is heated (reflowed) to melt the solder past 35. In the result, the solder 29 connected to the side surface A of the coating layer 25 and the outer surface B of the metal pad 24 is formed as shown in FIG. 2.

The embodiment of the present invention has been described with reference to the accompanying drawings. However, the present invention is not limited to the embodiment. The present invention can be carried out in forms to which various improvements, corrections, and modifications are added based on the knowledge of those skilled in the art without departing from the purpose of the present invention.

The invention claimed is:

1. An electrical connecting structure between a substrate and a semiconductor chip comprising:
 a metal bump of a semiconductor chip;
 a coating layer formed on the metal bump of the semiconductor chip, the coating layer including material not wettable with solder; and
 a solder directly connecting to a side surface of the metal bump, a side surface of the coating layer, and only a top surface of a metal pad not covered by the coating layer, wherein a surface of the coating layer in contact with the top surface of the metal pad has an area that is smaller than the top surface of the metal pad, wherein the side surface of the metal bump is coplanar with side surface of the coating layer.

2. The electrical connecting structure according to claim 1, wherein a side surface of the coating layer and a side surface of the metal bump have a uniform perpendicular surface.

3. The electrical connecting structure according to claim 2, wherein the solder connects to the side surface of the coating layer.

4. The electrical connecting structure according to claim 1, wherein the coating layer includes organic material.

5. The electrical connecting structure according to claim 4, wherein the organic material includes epoxy, polyimide, organic solderability preservative (OSP), or photo resist.

6. The electrical connecting structure, according to claim 1, wherein the coating layer includes aluminum (Al) or titanium (Ti).

7. The electrical connecting structure according to claim 1, wherein the metal bump includes a copper (Cu) bump.

8. An electrical package comprising:
 a substrate;
 a semiconductor chip; and
 a plurality of electrical connecting structures between the substrate and the semiconductor chip, each of the electrical connecting structures comprising:
 a metal bump of a semiconductor chip;
 a coating layer formed on the metal hump of the semiconductor chip, the coating layer including material not wettable with solder; and a solder directly connecting to a side surface of the metal bump, a side surface of the coating layer, and only a top surface of a metal pad not covered by the coating layer, wherein a surface of the coating layer in contact with the top surface of the metal pad has an area that is smaller than the top surface of the metal pad, wherein the side surface of the metal bump is coplanar with side surface of the coating layer.

9. The electrical package according to claim 8, wherein a side surface of the coating layer and a side surface of the metal bump have a uniform perpendicular surface.

10. The electrical package according to claim 9, wherein the solder connects to the side surface of the coating layer.

11. The electrical package according to claim 8, wherein the coating layer includes organic material.

12. The electrical package according to claim 11, wherein the organic material includes epoxy, polyimide, organic solderability preservative (OOP), or photo resist.

13. The electrical package according to claim 8, wherein the coating lay includes aluminum (Al) or titanium (Ti).

14. The electrical package according to claim 8, wherein the metal bump includes a copper (Cu) bump.

15. The electrical package according to claim 8, wherein the semiconductor chip includes a light emitting device or a light receiving device.

\* \* \* \* \*